United States Patent
Han (10) Patent No.: US 12,402,520 B2
(45) Date of Patent: Aug. 26, 2025

(54) DISPLAY WITH SLIDING DISPLAY TO EXPOSE A CAMERA

(71) Applicant: WUHAN CHINA STAR OPTOELECTRONICS SEMICONDUCTOR DISPLAY TECHNOLOGY CO., LTD., Wuhan (CN)

(72) Inventor: Wen Han, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 91 days.

(21) Appl. No.: 17/600,285

(22) PCT Filed: Sep. 6, 2021

(86) PCT No.: PCT/CN2021/116606
§ 371 (c)(1),
(2) Date: Dec. 22, 2022

(87) PCT Pub. No.: WO2022/262123
PCT Pub. Date: Dec. 22, 2022

(65) Prior Publication Data
US 2024/0130214 A1    Apr. 18, 2024

(30) Foreign Application Priority Data

Jun. 16, 2021   (CN) ......................... 202110668051.1

(51) Int. Cl.
*H10K 77/10*  (2023.01)
*H10K 59/40*  (2023.01)
(Continued)

(52) U.S. Cl.
CPC .......... *H10K 77/111* (2023.02); *H10K 59/40* (2023.02); *H10K 59/65* (2023.02);
(Continued)

(58) Field of Classification Search
CPC ...... H10K 77/111; H10K 59/40; H10K 59/65; H10K 59/8793; H10K 2102/311;
(Continued)

(56) References Cited

U.S. PATENT DOCUMENTS 10,868,264 B2 * 12/2020 Shin ....................... H10K 59/12
11,497,130 B2 * 11/2022 Song ..................... G06F 1/1652
(Continued)

FOREIGN PATENT DOCUMENTS

CN    108769305 A    11/2018
CN    110035153 A    7/2019
(Continued)

OTHER PUBLICATIONS

International Search Report in International application No. PCT/CN2021/116606, mailed on Jan. 13, 2022.
(Continued)

*Primary Examiner* — J. E. Schoenholtz
(74) *Attorney, Agent, or Firm* — PV IP PC; Wei Te Chung (57) ABSTRACT

A display module and a display device are provided. The display module includes a fixed function portion and a sliding display portion disposed oppositely. The fixed function portion includes a glass cover plate and a function layer disposed between the glass cover plate and the sliding display portion. The sliding display portion includes a first sub-part close to a side of the fixed function portion and a second sub-part bent and extended from the first sub-part (Continued)

and away from the side of the fixed function portion. The sliding display portion may slide relative to the fixed function portion.

20 Claims, 10 Drawing Sheets

(51) Int. Cl.
*H10K 59/65* (2023.01)
*H10K 59/80* (2023.01)
*H10K 102/00* (2023.01)

(52) U.S. Cl.
CPC ... *H10K 59/8793* (2023.02); *H10K 2102/311* (2023.02); *H10K 2102/351* (2023.02)

(58) Field of Classification Search
CPC ........... H10K 2102/351; H10K 59/871; H10K 59/8791; G09F 9/301
See application file for complete search history.

(56) References Cited

U.S. PATENT DOCUMENTS

| | | | | |
|---|---|---|---|---|
| 12,253,885 | B2* | 3/2025 | Kim | G06F 1/1624 |
| 2011/0176260 | A1* | 7/2011 | Walters | H04M 1/0268 |
| | | | | 361/679.01 |
| 2021/0385311 | A1* | 12/2021 | Kim | G06F 1/1677 |
| 2021/0405857 | A1* | 12/2021 | Kim | G06F 3/0481 |
| 2022/0068168 | A1* | 3/2022 | Lee | G06F 1/1616 |
| 2022/0124913 | A1* | 4/2022 | Kwak | G09F 9/30 |
| 2023/0259168 | A1* | 8/2023 | Gu | G06F 1/1652 |

FOREIGN PATENT DOCUMENTS

| | | |
|---|---|---|
| CN | 209134468 U | 7/2019 |
| CN | 110519419 A | 11/2019 |
| CN | 209913864 U | 1/2020 |
| CN | 210093271 U | 2/2020 |
| CN | 210429133 U | 4/2020 |
| CN | 111524459 A | 8/2020 |
| CN | 111654565 A | 9/2020 |
| CN | 111739414 A | 10/2020 |
| CN | 111970392 A | 11/2020 |
| CN | 112291392 A | 1/2021 |
| CN | 112291954 A | 1/2021 |
| WO | 2021071107 A1 | 4/2021 |

OTHER PUBLICATIONS

Written Opinion of the International Search Authority in International application No. PCT/CN2021/116606, mailed on Jan. 13, 2022.

Notification to Grant Patent Right for Invention issued in corresponding Chinese Patent Application No. 202110668051.1 dated Apr. 1, 2022, pp. 1-6.

* cited by examiner

DISPLAY WITH SLIDING DISPLAY TO EXPOSE A CAMERA

RELATED APPLICATIONS

This application is a Notional Phase of PCT Patent Application No. PCT/CN2021/116606 having international filing date of Sep. 6, 2021, which claims the benefit of priority of Chinese Patent Application No. 202110668051.1 filed on Jun. 16, 2021. The contents of the above applications are all incorporated by reference as if fully set forth herein in their entirety.

FIELD OF INVENTION

The present disclosure relates to the technical field of display, and particularly to a display module and a display device comprising the display module.

BACKGROUND

A full screen is a large-screen smart phone solution proposed by mobile phone manufacturers in recent years. In order to make a mobile phone have a higher screen ratio and better visual effects, there are various screen designs such as "notch screen", "water drop screen", and "pop-up Camera". The above solutions have disadvantages of high cost and poor practicability. Furthermore, there is still a camera installation position on a main screen, which cannot be regarded as a full screen in a true sense, and cannot meet users demand for a full screen. A "full screen" that has a higher screen ratio and is more concise and easy-to-use is what users are looking for, which can bring users a better visual enjoyment and use experience.

A flexible display screen is made of soft materials and is a bendable, rollable, and foldable display device. The flexible display screen has characteristics of lighter, thinner, and longer durability. The flexible display screen is a display screen device that can be moved like a scroll. Currently, a camera assembly is usually disposed under the flexible display screen. When there is no need to take a picture, the flexible display screen covers the camera assembly for full-screen display. When there is a need to take a picture, a part of the flexible display screen is rolled and accommodated to expose the camera assembly for taking pictures.

However, in a current laminated design of the flexible display screen, laminated layers participating in rolling up and accommodating are relatively thick. Therefore, when the flexible display screen is bent, the layers are easily peeled off and cracked, resulting in moisture intrusion into the flexible display screen during a test, and subsequent problems of poor display.

SUMMARY OF DISCLOSURE

The present disclosure provides a display module and a display device, which can reduce a thickness of a laminated structure participating in rolling up in the display module, thereby improving a rollability and reliability of the display module.

The present disclosure provides a display module comprising:
 a fixed function portion; and
 a sliding display portion disposed opposite to the fixed function portion and comprising a first sub-part close to a side of the fixed function portion and a second sub-part bent and extended from the first sub-part and away from the side of the fixed function portion;
 wherein the fixed function portion comprises a glass cover plate and a function layer disposed between the glass cover plate and the sliding display portion;
 the sliding display portion slides relative to the fixed function portion, so that the display module is switched between a first state and a second state;
 in the first state, the first sub-part is located on a side of the sliding display portion close to the fixed function portion; and
 in the second state, at least part of the first sub-part slides to a side of the sliding display portion away from the fixed function portion.

In an embodiment, the sliding display portion further comprises a display panel. A side of the display panel close to the function layer is a first sliding surface, and a side of the function layer close to the display panel is a second sliding surface.

In an embodiment, the function layer comprises a polarizing layer, and the polarizing layer is disposed on a side of the glass cover plate close to the display panel.

In an embodiment, the function layer further comprises an ultra-thin glass layer, the ultra-thin glass layer is disposed on a side of the polarizing layer close to the display panel, and a side of the ultra-thin glass layer close to the display panel is the second sliding surface.

In an embodiment, the function layer further comprises a touch layer, and the touch layer is disposed between the glass cover plate and the polarizing layer.

In an embodiment, the first sliding surface and the second sliding surface are provided with a first hardened coating, and a surface contact angle of the first hardened coating is greater than or equal to 100°.

In an embodiment, the sliding display portion further comprises a first support assembly disposed on a side of the display panel away from the fixed function portion. The first support assembly comprises a support layer. The support layer comprises a rigid part and a flexible part whose one end is connected to the rigid part and the other end is bent and away from the side of the fixed function portion. The flexible part comprises a plurality of openings, and a distribution density of the openings on a side of the flexible part close to the rigid part is less than a distribution density of the openings on a side of the flexible part away from the rigid part.

In an embodiment, the first support assembly further comprises a buffer film disposed between the support layer and the sliding display portion, and the buffer film is made of a polyurethane elastomer material.

In an embodiment, the display module further comprises a second support assembly disposed on the side of the sliding display portion away from the fixed function portion. The sliding display portion slides relative to the second support assembly.

In an embodiment, a side of the sliding display portion close to the second support assembly is a third sliding surface, and a side of the second support assembly close to the sliding display portion is a fourth sliding surface. The third sliding surface and the fourth sliding surface are provided with a second hardened coating, and a surface contact angle of the second hardened coating is greater than or equal to 100°.

In an embodiment, the display module further comprises a camera assembly disposed on the side of the sliding display portion away from the fixed function portion. When the display module is in the first state, an orthographic projection of the camera assembly on the fixed function portion is located within an orthographic projection of the sliding display portion on the fixed function portion. When the display module is in the second state, the orthographic projection of the camera assembly on the fixed function portion is outside the orthographic projection of the sliding display portion on the fixed function portion.

The present disclosure further provides a display device comprising a display module. The display module comprises:

a fixed function portion; and a sliding display portion disposed opposite to the fixed function portion and comprising a first sub-part close to a side of the fixed function portion and a second sub-part bent and extended from the first sub-part and away from the side of the fixed function portion;

wherein the fixed function portion comprises a glass cover plate and a function layer disposed between the glass cover plate and the sliding display portion;

the sliding display portion slides relative to the fixed function portion, so that the display module is switched between a first state and a second state;

in the first state, the first sub-part is located on a side of the sliding display portion close to the fixed function portion; and in the second state, at least part of the first sub-part slides to a side of the sliding display portion away from the fixed function portion.

In an embodiment, the sliding display portion further comprises a display panel. A side of the display panel close to the function layer is a first sliding surface, and a side of the function layer close to the display panel is a second sliding surface. The first sliding surface and the second sliding surface are provided with a first hardened coating, and a surface contact angle of the first hardened coating is greater than or equal to 100°.

In an embodiment, the function layer comprises a polarizing layer, and the polarizing layer is disposed on a side of the glass cover plate close to the display panel.

In an embodiment, the function layer further comprises an ultra-thin glass layer, the ultra-thin glass layer is disposed on a side of the polarizing layer close to the display panel, and a side of the ultra-thin glass layer close to the display panel is the second sliding surface.

In an embodiment, the function layer further comprises a touch layer, and the touch layer is disposed between the glass cover plate and the polarizing layer.

In an embodiment, the display module further comprises a camera assembly disposed on the side of the sliding display portion away from the fixed function portion. When the display module is in the first state, an orthographic projection of the camera assembly on the fixed function portion is located within an orthographic projection of the sliding display portion on the fixed function portion. When the display module is in the second state, the orthographic projection of the camera assembly on the fixed function portion is outside the orthographic projection of the sliding display portion on the fixed function portion.

In an embodiment, the display device further comprises a middle frame. The fixed function portion is fixedly connected to the middle frame, and the sliding display portion is movably connected to the middle frame, so that the display module is switched between the first state and the second state.

In an embodiment, the middle frame is provided with a sliding assembly. The sliding assembly comprises a sliding rail fixedly connected to the middle frame and a sliding block slidably connected to the sliding rail. The sliding display portion is fixedly connected to the sliding block.

In an embodiment, the display device further comprises an elastic member and a driving assembly. One end of the elastic member is connected to the middle frame, and the other end of the elastic member is connected to the first sub-part. The driving assembly is disposed on the middle frame. One end of the driving assembly is connected to the second sub-part, so that the display module is switched between the first state and the second state.

Compared with the prior art, in the present disclosure, a function layer is disposed between a sliding display portion and a glass cover plate, and the sliding display portion can slide relative to the function layer and the glass cover plate to be bent and accommodated. That is, the function layer does not participate in bending, so that a thickness of a laminated structure participating in the bending in the display module is reduced, thereby reducing a strain/dislocation generated in a bending process of the sliding display portion, improving a bendability of the display module, and improving a reliability and service life of the display module.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Figure 1:
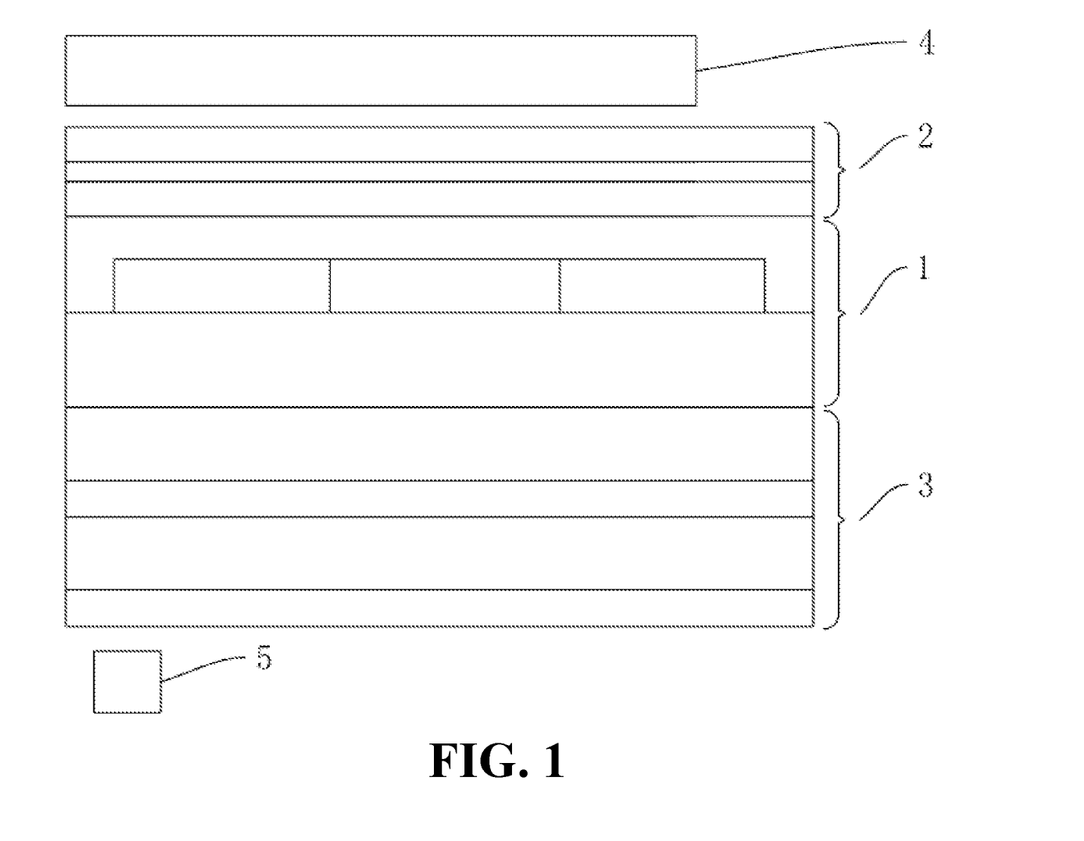
FIG. 1 is a schematic structural diagram of a display panel in the prior art.

Currently, an under-screen camera is usually disposed to achieve a full-screen display device. Please refer to FIG. 1, a display device comprises a panel body 1, an additional assembly 2 attached to a light-emitting side of the panel body 1, a backplane support assembly 3 disposed on a side of the panel body 1 away from the additional assembly 2, a glass cover plate 4 disposed on a side of the additional assembly 2 away from the panel body 1, and a camera 5 disposed on a side of the backplane support assembly 3 away from the panel body 1. The camera 5 is disposed under the panel body 1, thereby not affecting full-screen display of the display device. When functions such as taking pictures are needed, an end of the panel body 1 away from the camera 5 will slide and bend to a side of the panel body 1 away from the glass cover plate 4, thereby driving an end of the panel body 1 close to the camera 5 to move horizontally and expose the camera 5 to realize functions such as taking pictures. However, during a bending process of the panel body 1, the additional assembly 2 and the backplane support assembly 3 will be bent together with the panel body 1. Because a thickness of a laminated structure participating in bending is larger, layers are easily peeled off and cracked, resulting in risks of moisture and oxygen intrusion and poor display.

Accordingly, the present disclosure provides a display module. Please refer to FIG. 2, FIG. 3A, and FIG. 3B. The display module comprises a fixed function portion 101 and a sliding display portion 102 disposed oppositely.

Figure 2:
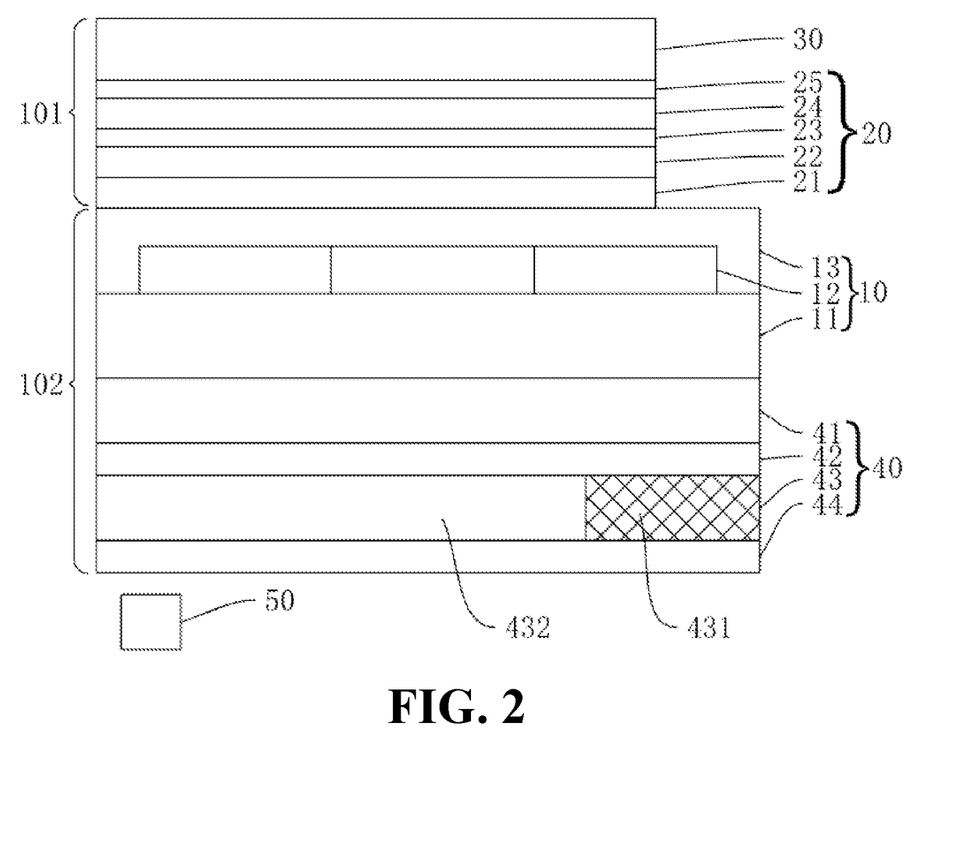
FIG. 2 is a schematic diagram of a structure of a display panel according to an embodiment of the present disclosure.
Figure 3A:
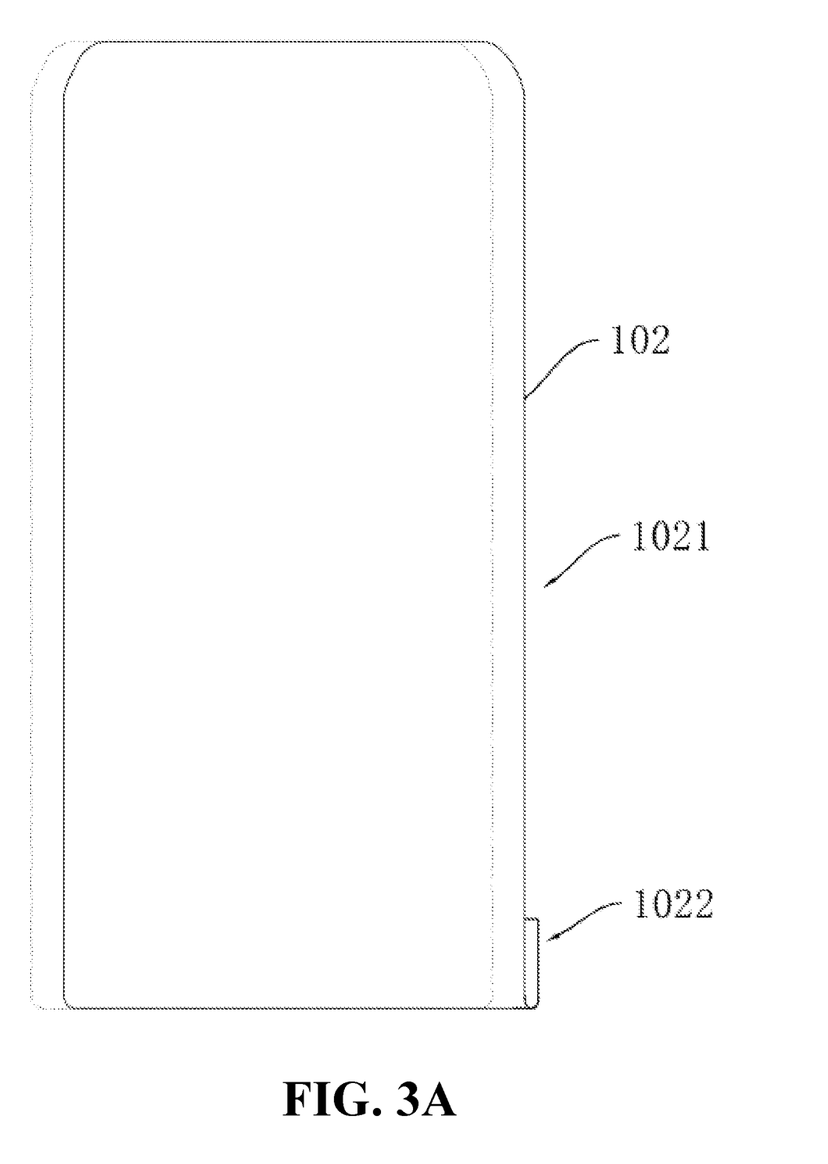
FIG. 3A is a schematic structural diagram of a first state of the display panel according to an embodiment of the present disclosure.
Figure 3B:
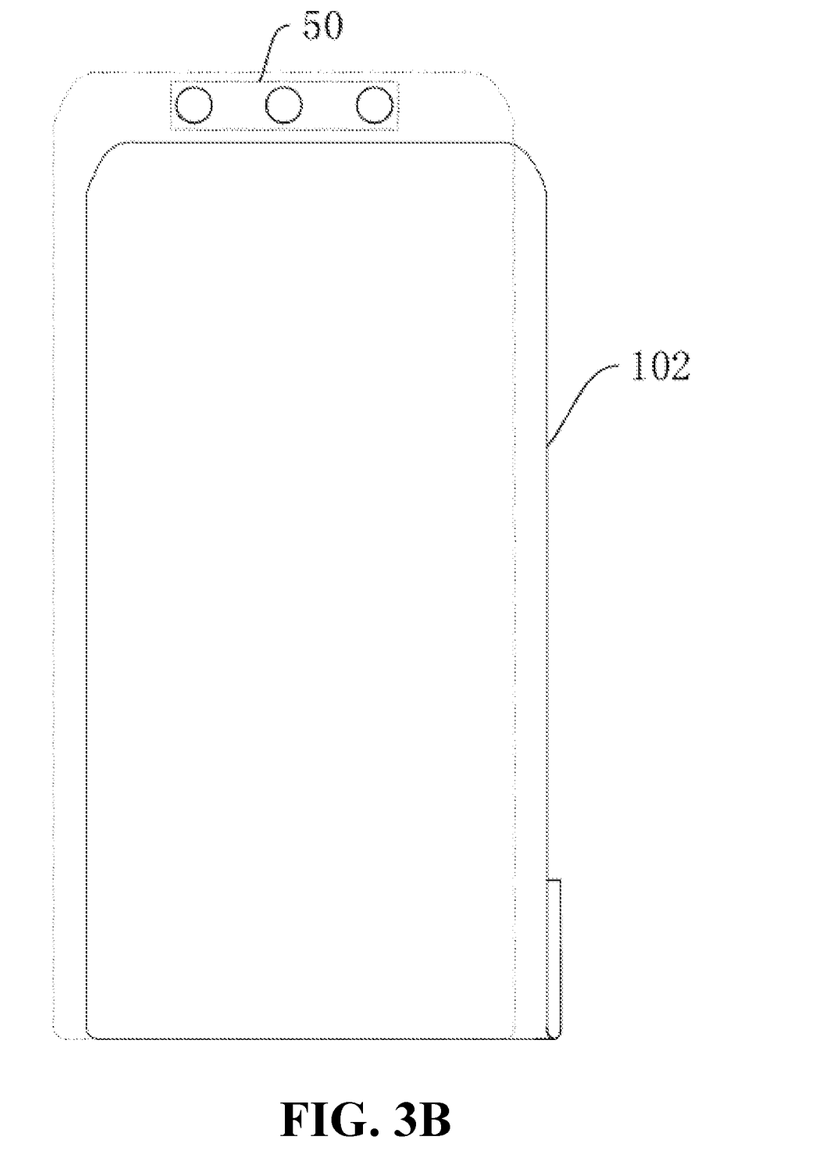
FIG. 3B is a schematic structural diagram of a second state of the display panel according to an embodiment of the present disclosure.

The fixed function portion 101 comprises a glass cover plate 30 and a function layer 20. The function layer 20 is disposed between the glass cover plate 30 and the sliding display portion 102.

The sliding display portion 102 comprises a first sub-par 1021 close to a side of the fixed function portion 101 and a second sub-part 1022 bent and extended from the first sub-part 1021 and away from the side of the fixed function portion 101.

The sliding display portion 102 slides relative to the fixed function portion 101, so that the display module is switched between a first state and a second state. In the first state, the first sub-part 1021 is located on a side of the sliding display portion 102 close to the fixed function portion 101. In the second state, at least part of the first sub-part 1021 slides to a side of the sliding display portion 102 away from the fixed function portion 101.

In an implementation of the present disclosure, the function layer 20 is disposed between the sliding display portion 102 and the glass cover plate 30, and the sliding display portion 102 can slide relative to the function layer 20 and the glass cover plate 30 to be bent and accommodated. That is, the function layer 20 does not participate in bending, so that a thickness of a laminated structure participating in the bending in the display module is reduced, thereby reducing a strain/dislocation generated in a bending process of the sliding display portion 102, improving a bendability of the display module, and improving a reliability and service life of the display module.

Specifically, please continue to refer to FIG. 2, FIG. 3A, and FIG. 3B. The display module comprises the sliding display portion 102, the fixed function portion 101 disposed on the sliding display portion 102, and a camera assembly 50 disposed under the sliding display portion 102.

The camera assembly 50 is located under the sliding display portion 102 and is covered by the sliding display portion 102, so that full-screen display can be realized. Furthermore, the sliding display portion 102 can slide relative to the fixed function portion 101. During a sliding process of the sliding display portion 102, a first end of the sliding display portion 102 away from the camera assembly 50 will bend away from a side of the fixed function portion 101. A second end of the sliding display portion 102 close to the camera assembly 50 will also slide toward the first end under a drive of the first end to expose the camera assembly 50, which can realize a photographing function.

That is, the sliding display portion 102 slides relative to the fixed function portion 101, so that the display module is switched between the first state and the second state. In the first state, the first sub-part 1021 is located on the side of the sliding display portion 102 close to the fixed function portion 101. In the second state, at least part of the first sub-part 1021 slides to the side of the sliding display portion 102 away from the fixed function portion 101.

Furthermore, when the display module is in the first state, an orthographic projection of the camera assembly 50 on the fixed function portion 101 is located within an orthographic projection of the sliding display portion 102 on the fixed function portion 101. When the display module is in the second state, the orthographic projection of the camera assembly 50 on the fixed function portion 101 is outside the orthographic projection of the sliding display portion 102 on the fixed function portion 101.

The fixed function portion 101 comprises the glass cover plate 30 and the function layer 20, and the function layer 20 may be disposed on the glass cover plate 30, so that the sliding display portion 102 slides relative to the glass cover 30 and the function layer 20.

It should be noted that, in the present disclosure, a surface of the sliding display portion 102 close to the function layer 20 and a surface of the function layer 20 close to the sliding display portion 102 are provided with a hardened coating, and a surface contact angle of the hardened coating is greater than or equal to 100°, thereby improving hardness and friction resistance of the surfaces. This can reduce a frictional force, so that a width of a gap between the sliding display portion 102 and the function layer 20 is close to 0, which improves display effect of the display module.

A structure of the display module provided by the present disclosure will be described in detail below in conjunction with specific embodiments.

In an embodiment, please refer to FIG. 2, FIG. 3A, and FIG. 3B, the display module comprises the fixed function portion 101 and the sliding display portion 102 disposed opposite to each other, and the camera assembly 50 disposed on the side of the sliding display portion 102 away from the fixed function portion 101.

The sliding display portion 102 comprises the first sub-par 1021 close to the side of the fixed function portion 101 and the second sub-part 1022 bent and extended from the first sub-part 1021 and away from the side of the fixed function portion 101. The sliding display portion 102 can slide relative to the fixed function portion 101, so that at least part of the first sub-part 1021 slides away from the side of the fixed function portion 101 to expose the camera assembly 50, and the display module is in the second state. And then, the sliding display portion 102 can slide relative to the fixed function portion 101, so that the at least part of the first sub-part 1021 slides back and close to the side of the fixed function portion 101, the sliding display portion 102 covers the camera assembly 50, and the display module is in the first state. By controlling the display module to switch between the first state and the second state, the display module is switched between full-screen display and functions such as taking pictures.

In this embodiment, the fixed function portion 101 comprises the glass cover plate 30 and the function layer 20 disposed between the glass cover plate 30 and the sliding display portion 102. The function layer 20 comprises a touch layer 24 disposed on a side of the glass cover plate 30 close to the sliding display portion 102, a polarizing layer 22 disposed on a side of the touch layer 24 close to the sliding display portion 102, and an ultra-thin glass layer 21 disposed on a side of the polarizing layer 22 close to the sliding display portion 102.

The touch layer 24 is attached to the glass cover plate 30 through a first adhesive layer 25, and the touch layer 24 is also attached to the polarizing layer 22 through a second adhesive layer 23.

Optionally, both the first adhesive layer 25 and the second adhesive layer 23 are made of a pressure sensitive adhesive.

The sliding display portion 102 comprises a display panel 10 and a first support assembly 40 disposed on a side of the display panel 10 away from the fixed function portion 101. That is, in this embodiment, a laminated structure participating in bending and sliding comprises the display panel 10 and the first support assembly 40.

In this embodiment, a side of the display panel 10 close to the fixed function portion 101 is a first sliding surface. A side of the function layer 20 close to the display panel 10 is a second sliding surface. That is, the second sliding surface is a side of the ultra-thin glass layer 21 close to the display panel 10. The first sliding surface and the second sliding surface are provided with a first hardened coating, so as to improve hardness and friction resistance of the first sliding surface and the second sliding surface and increase the service life of the display module. Furthermore, a surface contact angle of the first hardened coating is greater than or equal to 100°, which can reduce a frictional force, so that a width of a gap between the display panel 10 and the ultra-thin glass layer 21 is close to 0, thereby improving the display effect of the display module.

The display panel 10 comprises a thin film transistor array substrate 11, a pixel light-emitting layer 12 disposed on the thin film transistor array substrate 11, and an encapsulation layer 13 covering the pixel light-emitting layer 12. The pixel light-emitting layer 12 may be an OLED light-emitting layer made of organic light-emitting materials, and is connected to thin-film transistor devices in the thin-film transistor array substrate 11 to realize signal transmission and emit light.

The first support assembly 40 comprises a back plate 41 close to a side of the display panel 10, a buffer film 42 disposed on a side of the back plate 41 away from the display panel 10, a support layer 43 disposed on a side of the buffer film 42 away from the display panel 10, and a protective glue layer 44 disposed on a side of the support layer 43 away from the display panel 10.

Figure 4:
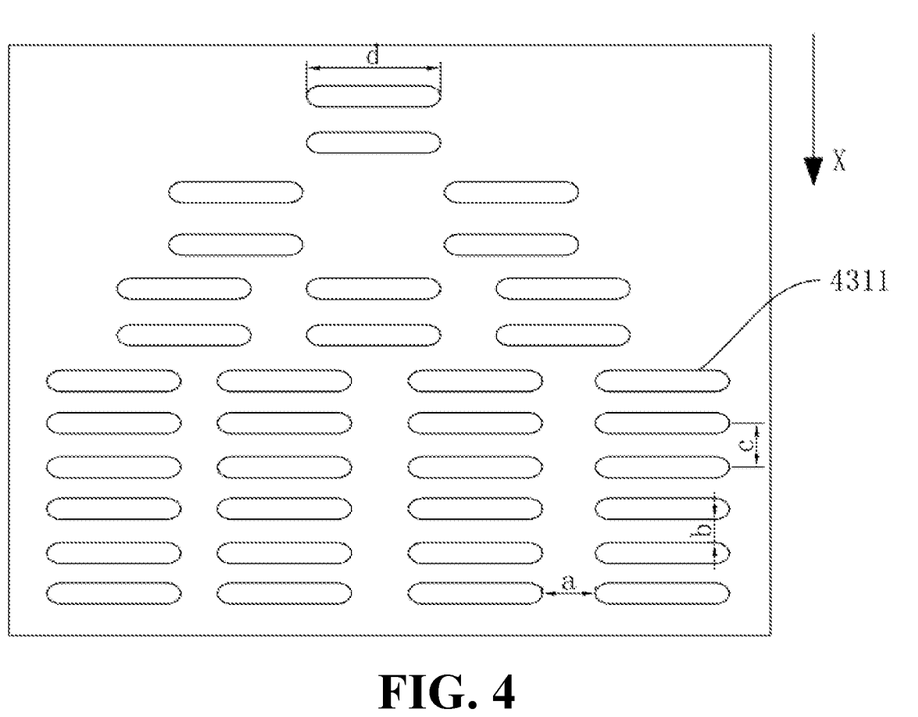
FIG. 4 is a schematic structural diagram of a distribution of a plurality of openings according to an embodiment of the present disclosure.

Please refer to FIG. 2 and FIG. 4, the support layer 43 comprises a rigid part 432 and a flexible part 431 whose one end is connected to the rigid part 432 and the other end is bent and away from the side of the fixed function portion 101. The flexible part 431 comprises a plurality of openings 4311, and a distribution density of the openings 4311 on a side of the flexible part 431 close to the rigid part 432 is less than a distribution density of the openings 4311 on a side of the flexible part 431 away from the rigid part 432.

A direction from the rigid part 432 to the flexible part 431 is defined as a first direction X. The distribution density of the openings 4311 on the side of the flexible part 431 close to the rigid part 432 may increase along the first direction X. The distribution density of the openings 4311 on the side of the flexible part 431 away from the rigid part 432 may remain unchanged along the first direction X. That is, in the present disclosure, the openings 4311 with a gradual distribution density are formed on the side of the flexible part 431 close to the rigid part 432, which prevents stress concentration at an interface between the rigid part 432 and the flexible part 431 due to the openings during a bending process, thereby improving product yield.

Specifically, a distance a between two adjacent openings 4311 in a direction perpendicular to the first direction X is 0.16 to 2.5 mm. A distance b between two adjacent openings 4311 in the first direction X is 0.114 to 0.271 mm. A distance c between central axes of two adjacent openings 4311 in the first direction X is 0.314 to 0.471 mm. A length d of the openings 4311 in the direction perpendicular to the first direction X is 1.9 to 4.24 mm. Parameters of the openings 4311 may be selected according to actual needs, and are not limited herein.

In this embodiment, the buffer film 42 is made of a polyurethane elastomer material. Compared with current foams, the polyurethane elastomer material has excellent cushioning property, toughness, and wear resistance. Therefore, the buffer film 42 may be made thinner to further reduce a thickness of the sliding display portion 102, thereby improving a bendability of the sliding display portion 102.

In the above, in this embodiment, the polarizing layer 22 and the touch layer 24 are both disposed in the function layer 20, and do not participate in bending and sliding of the sliding display portion 102, thereby reducing the thickness of the sliding display portion 102. This improves the bendability of the sliding display portion 102, and reduces a risk of peeling and cracking of layers of the sliding display portion 102 during the bending process. Furthermore, in this embodiment, the side of the ultra-thin glass layer 21 close to the display panel 10 and a side of the display panel 10 close to the ultra-thin glass layer 21 are provided with the first hardened coating, thereby improving friction resistance and hardness of sliding surfaces of the two sides and increasing a service life of the display module.

Figure 5:
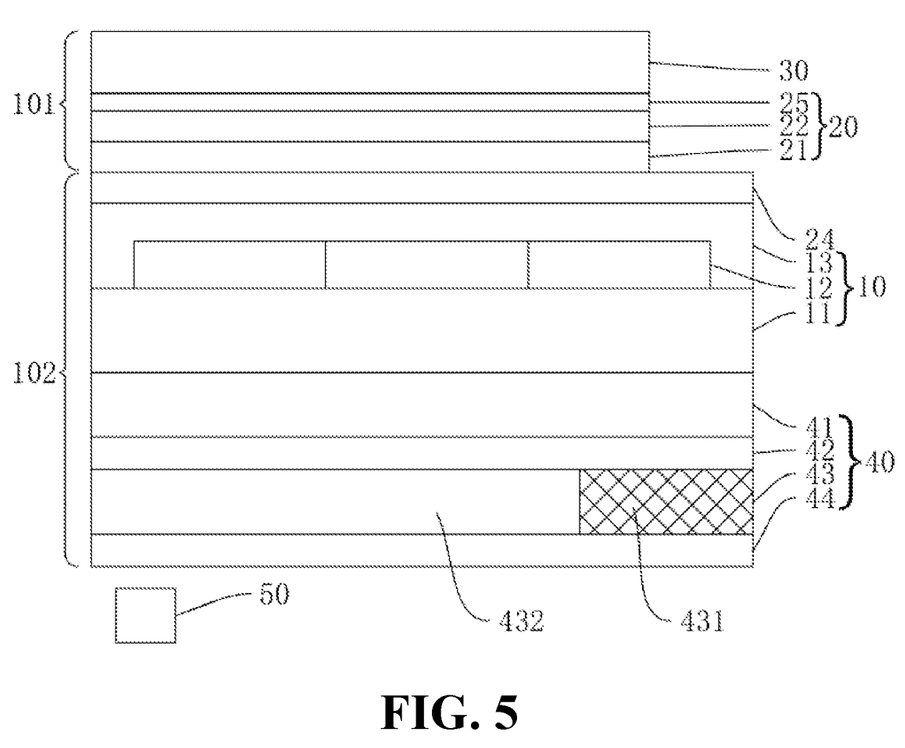
FIG. 5 is a schematic diagram of another structure of the display panel according to an embodiment of the present disclosure.

In another embodiment, please refer to FIG. 5, this embodiment differs from the first embodiment in laminated structures of a sliding display portion 102 and a function layer 20.

In this embodiment, the function layer 20 comprises a polarizing layer 22 disposed on a side of a glass cover plate 30 close to a display panel 10, and an ultra-thin glass layer 21 disposed on a side of a polarizing layer 22 close to the display panel 10. The polarizing layer 22 is attached to the glass cover plate 30 through a first adhesive layer 25.

The sliding display portion 102 comprises the display panel 10, a first support assembly 40 disposed on a side of the display panel 10 away from a fixed function portion 101, and a touch layer 24 disposed on a side of the display panel 10 close to the fixed function portion 101.

It should be noted that the touch layer 24 is not limited to a laminated position in this embodiment. The touch layer 24 may also be disposed inside the display panel 10 to form an in-cell touch display panel, which is not limited herein.

In addition, a surface of the ultra-thin glass layer 21 close to the touch layer 24 and a surface of the touch layer 24 close to the ultra-thin glass layer 21 are provided with a third hardened coating to improve hardness and friction resistance. This can reduce a frictional force, so that a width of a gap between the display panel 10 and the ultra-thin glass layer 21 is close to 0, thereby improving display effect of the display module.

In this embodiment, the polarizing layer 22 is disposed in the function layer 20, and do not participate in bending and sliding of the sliding display portion 102, thereby reducing the thickness of the sliding display portion 102. This improves a bendability of the sliding display portion 102, and reduces a risk of peeling and cracking of layers of the sliding display portion 102 during the bending process. Furthermore, in this embodiment, the side of the ultra-thin glass layer 21 close to the touch layer 24 and a side of the touch layer 24 close to the ultra-thin glass layer 21 are provided with the third hardened coating, thereby improving friction resistance and hardness of sliding surfaces of the two sides and increasing a service life of the display module.

Figure 6:
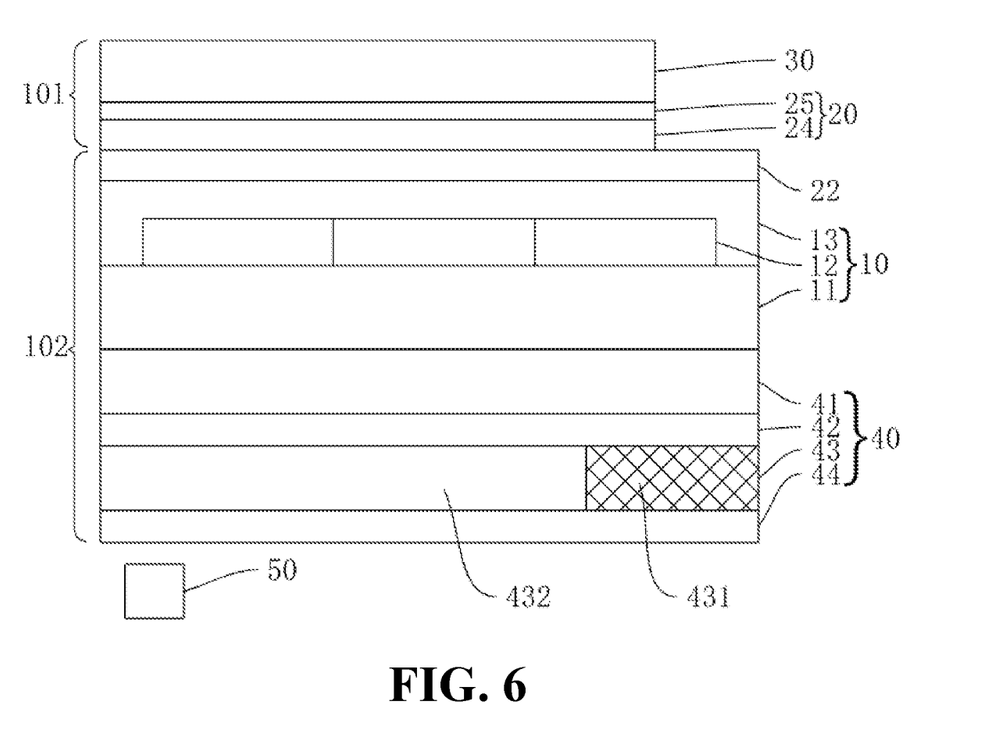
FIG. 6 is a schematic diagram of another structure of the display panel according to an embodiment of the present disclosure.

In another embodiment, please refer to FIG. 6, this embodiment differs from the first embodiment in laminated structures of a sliding display portion 102 and a function layer 20.

The function layer 20 comprises a touch layer 24 disposed between a glass cover plate 30 and the sliding display portion 102, and the touch layer 24 is attached to the glass cover plate 30 through a first adhesive layer 25.

The touch layer 24 may comprise a glass substrate and a touch electrode layer disposed on the glass substrate, and a side of the glass substrate close to a display panel 10 is provided with a hardened coating.

The sliding display portion 102 comprises the display panel 10, a first support assembly 40 disposed on a side of the display panel 10 away from a fixed function portion 101, and a polarizing layer 22 disposed on a side of the display panel 10 close to the fixed function portion 101.

A surface of the touch layer 24 close to the polarizing layer 22 and a surface of the polarizing layer 22 close to the touch layer 24 are provided with a fourth hardened coating to improve hardness and friction resistance of the surfaces. Furthermore, in this embodiment, a surface contact angle of the fourth hardened coating is greater than or equal to 100°, which can reduce a frictional force, so that a width of a gap between the polarizing layer 22 and the touch layer 24 is close to 0, thereby improving display effect of the display module.

In this embodiment, the touch layer 24 is disposed in the function layer 20, and do not participate in bending and sliding of the sliding display portion 102, thereby reducing the thickness of the sliding display portion 102. This improves a bendability of the sliding display portion 102, and reduces a risk of peeling and cracking of layers of the sliding display portion 102 during the bending process. Furthermore, in this embodiment, the side of the polarizing layer 22 close to the touch layer 24 and a side of the touch layer 24 close to the polarizing layer 22 are provided with the fourth hardened coating, thereby improving friction resistance and hardness of sliding surfaces of the two sides and increasing a service life of the display module.

Figure 7:
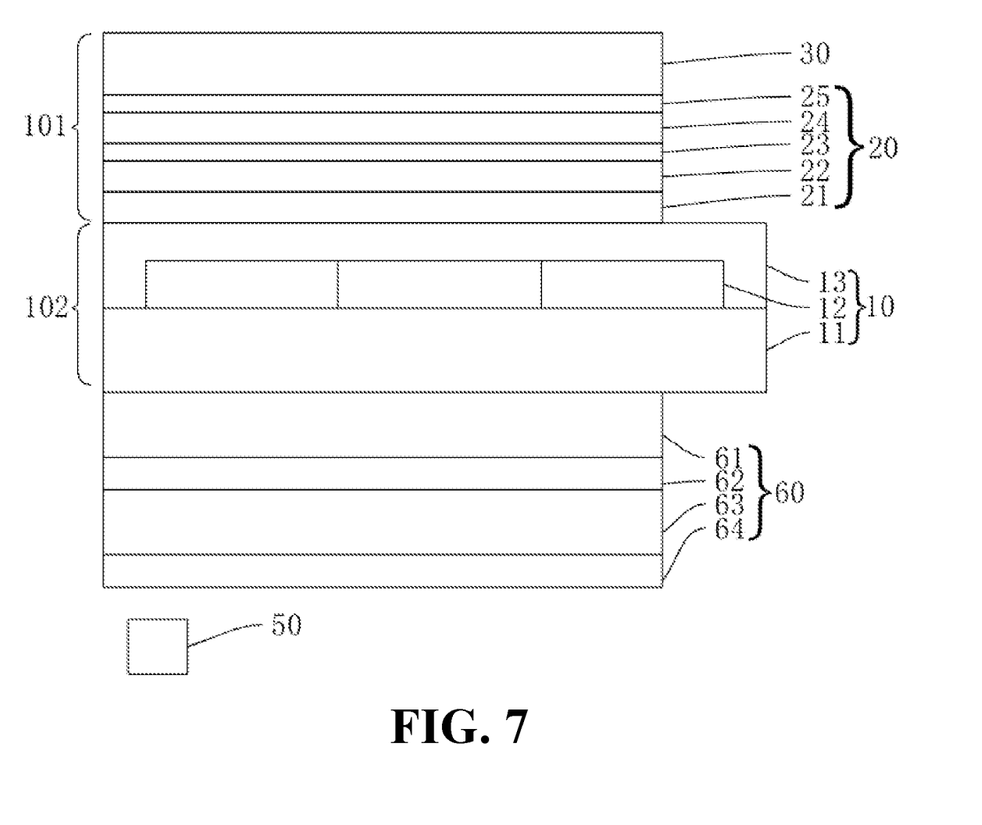
FIG. 7 is a schematic diagram of another structure of the display panel according to an embodiment of the present disclosure.

In another embodiment, please refer to FIG. 7, this embodiment differs from the first embodiment in a laminated structure of a sliding display portion 102.

Specifically, in this embodiment, a fixed function portion 101 comprises a glass cover plate 30 and a function layer 20 disposed between a glass cover plate 30 and the sliding display portion 102. The function layer 20 comprises a touch layer 24 disposed on a side of the glass cover plate 30 close to the sliding display portion 102, a polarizing layer 22 disposed on a side of the touch layer 24 close to the sliding display portion 102, and an ultra-thin glass layer 21 disposed on a side of the polarizing layer 22 close to the sliding display portion 102.

The touch layer 24 is attached to the glass cover plate 30 through a first adhesive layer 25, and the touch layer 24 is also attached to the polarizing layer 22 through a second adhesive layer 23.

Optionally, both the first adhesive layer 25 and the second adhesive layer 23 are made of a pressure sensitive adhesive.

The sliding display portion 102 comprises a display panel 10. A surface of the ultra-thin glass layer 21 close to the display panel 10 and a surface of the display panel 10 close to the ultra-thin glass layer 21 are provided with a first hardened coating, and a surface contact angle of the first hardened coating is greater than or equal to 100°, so as to improve hardness and friction resistance of the surfaces. This can reduce a frictional force, so that a width of a gap between the display panel 10 and the ultra-thin glass layer 21 is close to 0, thereby improving display effect of the display module.

The display module further comprises a second support assembly 60 disposed on a side of the sliding display portion 102 away from the fixed function portion 101. The sliding display portion 102 also slides relative to the second support assembly 60.

The second support assembly 60 comprises a fixed back plate 61 close to a side of the display panel 10, a fixed support layer 62 disposed on a side of the fixed back plate 61 away from the display panel 10, a fixed buffer layer 63 disposed on a side of the fixed support layer 62 away from the display panel 10, and a fixed protective glue layer 64 disposed on a side of the fixed buffer layer 63 away from the display panel 10.

A side of the display panel 10 close to the second support assembly 60 is a third sliding surface, and a side of the second support assembly 60 close to the display panel 10 is a fourth sliding surface. The third sliding surface and the fourth sliding surface are provided with a second hardened coating, and a surface contact angle of the second hardened coating is greater than or equal to 100°, so as to improve hardness and friction resistance of the surfaces. This can reduce a frictional force, so that a width of a gap between the display panel 10 and the second support assembly 60 is close to 0, thereby improving display effect of the display module.

The second hardened coating is disposed on a surface of the fixed back plate 61 close to the display panel 10.

In this embodiment, a camera assembly 50 is disposed on a side of the second support assembly 60 away from the display panel 10.

In this embodiment, the polarizing layer 22 and the touch layer 24 are both disposed in the function layer 20, and do not participate in bending and sliding of the sliding display portion 102, thereby reducing the thickness of the sliding display portion 102. Furthermore, this embodiment is further provided with the second support assembly 60, and the sliding display portion 102 also slides relative to the second support assembly 60. That is, the second support assembly 60 also does not participate in the bending and sliding of the sliding display portion 102, which further reduces a thickness of a laminated structure participating in the bending and sliding in the display module. This improves a bendability of the sliding display portion 102, and reduces a risk of peeling and cracking of layers of the sliding display portion 102 during the bending process. Furthermore, in this embodiment, a side of the ultra-thin glass layer 21 close to the display panel 10, a side of the display panel 10 close to the ultra-thin glass layer 21, a side of the display panel 10 close to the fixed back plate 61, and a side of the fixed back plate 61 close to the display panel 10 are provided with a hardened coating, thereby improving friction resistance and hardness of sliding surfaces of the four sides and increasing a service life of the display module.

Optionally, in the present disclosure, the first hardened coating, the second hardened coating, the third hardened coating, and the fourth hardened coating are all made of a same material and composition.

In addition, the present disclosure further provides a display device. The display device comprises the display module described in any of the above embodiments. Please refer to FIG. 2, FIG. 3A, FIG. 3B, FIG. 8, and FIG. 9.

Figure 8:
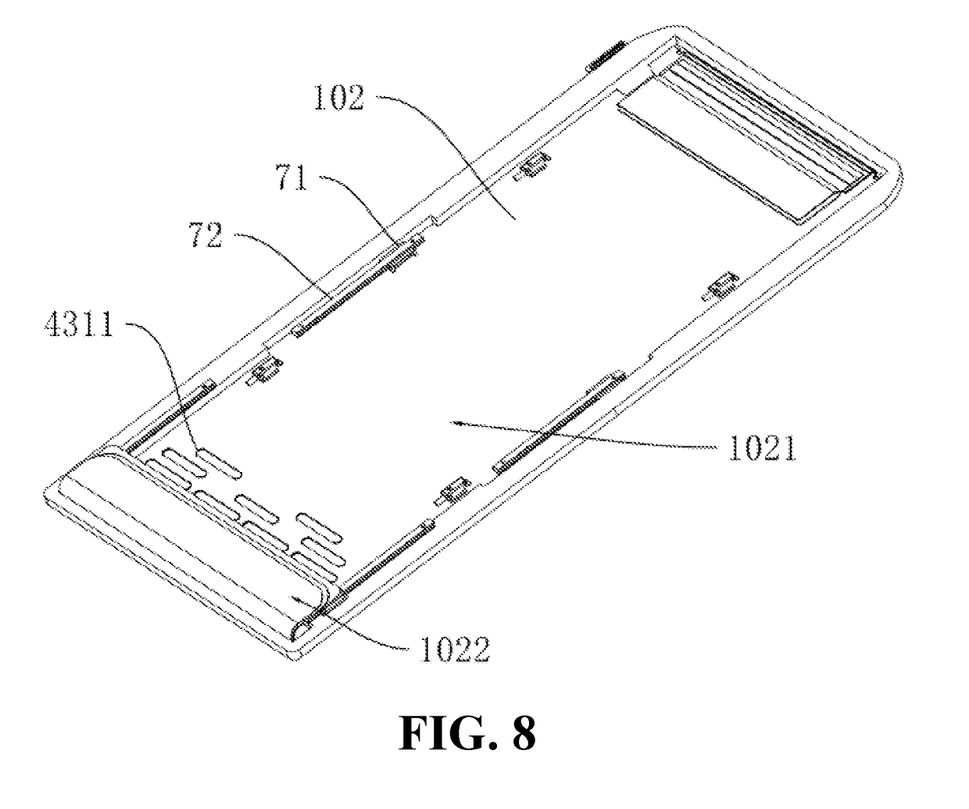
FIG. 8 is a schematic rear view of the display panel according to an embodiment of the present disclosure.
Figure 9:
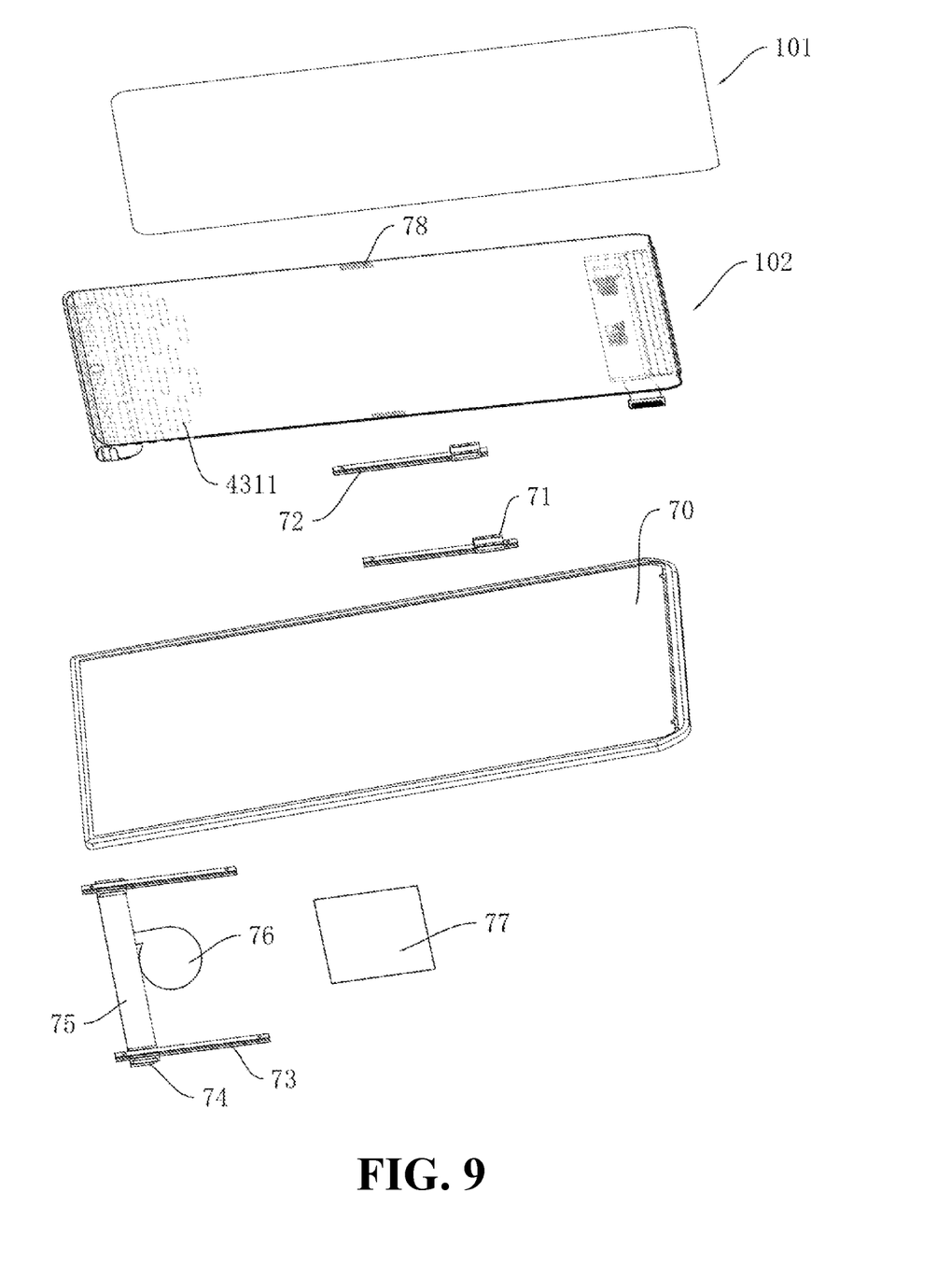
FIG. 9 is an exploded schematic structural diagram of the display panel according to an embodiment of the present disclosure.

The display device comprises the display module and a middle frame 70, and the display module is disposed on the middle frame 70

Specifically, the fixed function portion 101 is fixedly connected to the middle frame 70. The sliding display portion 102 is movably connected to the middle frame 70. The fixed function portion 101 is disposed on a light-emitting side of the sliding display portion 102.

Furthermore, the middle frame 70 is provided with a sliding assembly. The sliding assembly comprises two sliding rails 72 fixedly connected to the middle frame 70 and two sliding blocks 71 slidably connected to the sliding rails 72. The sliding display portion 102 is fixedly connected to the sliding blocks 71. Therefore, when the sliding blocks 71 slide on the sliding rails 72, the sliding display portion 102 can also be driven to slide.

Optionally, the sliding assembly may also comprise two sliding blocks 71 fixedly connected to the middle frame 70, and two sliding rails 72 slidably connected to the sliding blocks 71, The sliding display portion 102 is fixedly connected to the sliding rails 72. Therefore, when the sliding rails 72 slides relative to the sliding blocks 71, the sliding display portion 102 can also be driven to slide.

Optionally, the sliding assembly may also comprise a track and a roller that can be movably connected, and the track and the roller are respectively disposed on the middle frame 70 and the sliding display portion 102.

The display device further comprises a driving assembly and an elastic member 78. The driving assembly comprises an electrical machine 76. Optionally, the elastic member 78 comprises a return spring, and the electrical machine 76 comprises a motor.

One end of the elastic member 78 is connected to the middle frame 70, and the other end of the elastic member 78 is connected to a first sub-part 1021. The driving assembly is disposed on the middle frame 70. One end of the driving assembly is connected to a second sub-part 1022. When the display module needs to perform functions such as taking pictures, the second sub-part 1022 and at least part of the first sub-part 1021 are driven to bend and extend away from a side of the fixed function portion 101 by the driving assembly, so as to expose a camera assembly 50 and make the display module in a second state. At this time, the elastic member 78 is in a compressed or stretched state, and has a certain elastic potential energy. When it needs to switch to a first state, the elastic potential energy of the elastic member 78 will facilitate sliding of the sliding display portion 102 and switching to the first state.

It should be noted that the driving assembly is disposed on a side of the sliding display portion 102 away from the fixed function portion 101, and at an end of the sliding display portion 102 away from the camera assembly 50. Therefore, the driving assembly can drive the second sub-part 1022 to slide, and drive the sliding display portion 102 to slide on the slide rails 72. That is, the driving assembly drives at least part of the first sub-part 1021 to bend and extend to the side of the sliding display portion 102 away from the fixed function portion 101 to expose the camera assembly 50.

Furthermore, in order to maintain a sliding direction and stability of the sliding display portion 102, the driving assembly further comprises two pulling rails 73 disposed on opposite sides of the middle frame 70, two pulling sliders 74 slidably connected to the pulling rails 73, and a cross bar 75 connected between the two pulling sliders 74. The second sub-part 1022 is connected to the cross bar 75 or the pulling sliders 74, and the electrical machine 76 is connected to the cross bar 75. Therefore, the electrical machine 76 can pull the cross bar 75, and the cross bar 75 slides on the pulling rails 73 via the pulling sliders 74 to drive the second sub-part 1022 to slide.

In the present disclosure, the pulling rails 73, the pulling sliders 74, the cross bar 75, and the electrical machine 76 are all disposed on the side of the sliding display portion 102 away from the fixed function portion 101, and at the end of the sliding display portion 102 away from the camera assembly 50, so that they can pull the second sub-part 1022 to slide, and drive at least part of the first sub-part 1021 to bend and extend to the side of the sliding display portion 102 away from the fixed function portion 101, thereby exposing the camera assembly 50 and making the display module in the second state.

At this time, one end of the elastic member 78 is connected to the middle frame 70, and the other end of the elastic member 78 is connected to the sliding display portion 102. Because the sliding display portion 102 is moved, the elastic member 78 is in the compressed or stretched state, and has a certain elastic potential energy.

When the display device does not need to perform functions such as taking pictures, but needs to perform full-screen display, that is, when it needs to switch from the second state to the first state, the electrical machine 76 stops pulling the cross bar 75 or apply a reverse pushing force to a side of the cross bar 75, which, in combination with an elastic force of the elastic member 78, causes the sliding display portion 102 to slide in an opposite direction. Therefore, the at least part of the first sub-part 1021 bent and extended to the side of the sliding display portion 102 away from the fixed function portion 101 can be restored to the side of the sliding display portion 102 close to the fixed function portion 101 to cover the camera assembly 50 and realize full-screen display.

It should be noted that the display device further comprises a power element 77 disposed on the middle frame 70 and electrically connected to the sliding display portion 102. The power element 77 comprises a battery and a system drive board, which is not limited herein.

In the above, in the present disclosure, the function layer 20 is disposed in the fixed functional portion 101 and does not slide and bend with the sliding display portion 102, so that a thickness of a laminated structure participating in the bending in the display module is reduced, thereby reducing a strain/dislocation generated in a bending process of the sliding display portion, improving a bendability of the display module, and improving a reliability and service life of the display module.

In the above embodiments, the description of each embodiment has its own emphasis. For parts not detailed in one embodiment, reference may be made to the related descriptions in other embodiments.

The display substrates provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display module, comprising:
a fixed function portion; and
a sliding display portion disposed opposite to the fixed function portion and comprising a first sub-part close to a side of the fixed function portion and a second sub-part bent and extended from the first sub-part and away from the side of the fixed function portion;
wherein the fixed function portion comprises a glass cover plate and a function layer disposed between the glass cover plate and the sliding display portion;
the sliding display portion slides relative to the fixed function portion, so that the display module is switched between a first state and a second state;
in the first state, the first sub-part is located on a side of the sliding display portion close to the fixed function portion; and
in the second state, at least part of the first sub-part slides to a side of the sliding display portion away from the fixed function portion.

2. The display module according to claim 1, wherein the sliding display portion further comprises a display panel, a side of the display panel close to the function layer is a first sliding surface, and a side of the function layer close to the display panel is a second sliding surface.

3. The display module according to claim 2, wherein the function layer comprises a polarizing layer, and the polarizing layer is disposed on a side of the glass cover plate close to the display panel.

4. The display module according to claim 3, wherein the function layer further comprises an ultra-thin glass layer, the ultra-thin glass layer is disposed on a side of the polarizing layer close to the display panel, and a side of the ultra-thin glass layer close to the display panel is the second sliding surface.

5. The display module according to claim 4, wherein the function layer further comprises a touch layer, and the touch layer is disposed between the glass cover plate and the polarizing layer.

6. The display module according to claim 2, wherein the first sliding surface and the second sliding surface are provided with a first hardened coating, and a surface contact angle of the first hardened coating is greater than or equal to 100°.

7. The display module according to claim 2, wherein the sliding display portion further comprises a first support assembly disposed on a side of the display panel away from the fixed function portion, the first support assembly comprises a support layer, the support layer comprises a rigid part and a flexible part whose one end is connected to the rigid part and the other end is bent and away from the side of the fixed function portion, the flexible part comprises a plurality of openings, and a distribution density of the openings on a side of the flexible part close to the rigid part is less than a distribution density of the openings on a side of the flexible part away from the rigid part.

8. The display module according to claim 7, wherein the first support assembly further comprises a buffer film disposed between the support layer and the sliding display portion, and the buffer film is made of a polyurethane elastomer material.

9. The display module according to claim 1, further comprising:
a second support assembly disposed on the side of the sliding display portion away from the fixed function portion, wherein the sliding display portion slides relative to the second support assembly.

10. The display module according to claim 9, wherein a side of the sliding display portion close to the second support assembly is a third sliding surface, a side of the second support assembly close to the sliding display portion is a fourth sliding surface, the third sliding surface and the fourth sliding surface are provided with a second hardened coating, and a surface contact angle of the second hardened coating is greater than or equal to 100°.

11. The display module according to claim 1, further comprising:
a camera assembly disposed on the side of the sliding display portion away from the fixed function portion;
wherein when the display module is in the first state, an orthographic projection of the camera assembly on the fixed function portion is located within an orthographic projection of the sliding display portion on the fixed function portion; and
when the display module is in the second state, the orthographic projection of the camera assembly on the fixed function portion is outside the orthographic projection of the sliding display portion on the fixed function portion.

12. A display device, comprising a display module, wherein the display module comprises:
a fixed function portion; and
a sliding display portion disposed opposite to the fixed function portion and comprising a first sub-part close to a side of the fixed function portion and a second sub-part bent and extended from the first sub-part and away from the side of the fixed function portion;
wherein the fixed function portion comprises a glass cover plate and a function layer disposed between the glass cover plate and the sliding display portion;
the sliding display portion slides relative to the fixed function portion, so that the display module is switched between a first state and a second state;
in the first state, the first sub-part is located on a side of the sliding display portion close to the fixed function portion; and in the second state, at least part of the first sub-part slides to a side of the sliding display portion away from the fixed function portion.

13. The display device according to claim 12, wherein the sliding display portion further comprises a display panel, a side of the display panel close to the function layer is a first sliding surface, a side of the function layer close to the display panel is a second sliding surface, the first sliding surface and the second sliding surface are provided with a first hardened coating, and a surface contact angle of the first hardened coating is greater than or equal to 100°.

14. The display device according to claim 13, wherein the function layer comprises a polarizing layer, and the polarizing layer is disposed on a side of the glass cover plate close to the display panel.

15. The display device according to claim 14, wherein the function layer further comprises an ultra-thin glass layer, the ultra-thin glass layer is disposed on a side of the polarizing layer close to the display panel, and a side of the ultra-thin glass layer close to the display panel is the second sliding surface.

16. The display device according to claim 15, wherein the function layer further comprises a touch layer, and the touch layer is disposed between the glass cover plate and the polarizing layer.

17. The display device according to claim 12, wherein the display module further comprises:
a camera assembly disposed on the side of the sliding display portion away from the fixed function portion;
wherein when the display module is in the first state, an orthographic projection of the camera assembly on the fixed function portion is located within an orthographic projection of the sliding display portion on the fixed function portion; and
when the display module is in the second state, the orthographic projection of the camera assembly on the fixed function portion is outside the orthographic projection of the sliding display portion on the fixed function portion.

18. The display device according to claim 12, further comprising a middle frame, wherein the fixed function portion is fixedly connected to the middle frame, and the sliding display portion is movably connected to the middle frame, so that the display module is switched between the first state and the second state.

19. The display device according to claim 18, wherein the middle frame is provided with a sliding assembly, the sliding assembly comprises a sliding rail fixedly connected to the middle frame and a sliding block slidably connected to the sliding rail, and the sliding display portion is fixedly connected to the sliding block.

20. The display device according to claim 18, further comprising:
an elastic member, wherein one end of the elastic member is connected to the middle frame, and the other end of the elastic member is connected to the first sub-part; and
a driving assembly disposed on the middle frame, wherein one end of the driving assembly is connected to the second sub-part, so that the display module is switched between the first state and the second state.

* * * * *